(12) United States Patent
Farooq et al.

(10) Patent No.: US 9,059,333 B1
(45) Date of Patent: Jun. 16, 2015

(54) FACILITATING CHIP DICING FOR METAL-METAL BONDING AND HYBRID WAFER BONDING

(71) Applicant: International Business Machines Corporation, Armonk, NY (US)

(72) Inventors: Mukta G. Farooq, Hopewell Junction, NY (US); Erdem Kaltalioglu, Newburgh, NY (US); Wei Lin, Albany, NY (US); Spyridon Skordas, Wappingers Falls, NY (US); Kevin R. Winstel, East Greenbush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/096,325

(22) Filed: Dec. 4, 2013

(51) Int. Cl.
| | |
|---|---|
| H01L 21/768 | (2006.01) |
| H01L 21/78 | (2006.01) |
| H01L 23/544 | (2006.01) |
| H01L 23/00 | (2006.01) |

(52) U.S. Cl.
CPC .............. *H01L 24/94* (2013.01); *H01L 23/544* (2013.01); *H01L 21/78* (2013.01); *H01L 23/562* (2013.01); *H01L 24/89* (2013.01); *H01L 24/67* (2013.01); *H01L 2223/5446* (2013.01); *H01L 2924/2064* (2013.01); *H01L 2924/0537* (2013.01); *H01L 2924/01025* (2013.01); *H01L 2924/14* (2013.01); *H01L 2224/94* (2013.01); *H01L 2225/06593* (2013.01)

(58) Field of Classification Search
CPC .................. H01L 2224/94; H01L 2225/06593
See application file for complete search history.

(56) References Cited

U.S. PATENT DOCUMENTS

| | | | |
|---|---|---|---|
| 5,091,331 | A | 2/1992 | Delgado et al. |
| 5,656,552 | A | 8/1997 | Hudak et al. |
| 5,691,248 | A | 11/1997 | Cronin et al. |
| 7,067,397 | B1 | 6/2006 | Chang-Chien et al. |
| 7,115,997 | B2 | 10/2006 | Narayan et al. |
| 7,235,864 | B2 | 6/2007 | Lee |
| 7,534,651 | B2 | 5/2009 | Narayan et al. |
| 7,858,497 | B2 * | 12/2010 | Nakamura ............... 438/462 |
| 7,888,776 | B2 | 2/2011 | Ogawa et al. |
| 8,114,707 | B2 | 2/2012 | Farooq et al. |
| 8,159,254 | B2 | 4/2012 | Kaltalioglu |
| 8,299,609 | B2 | 10/2012 | Cohn et al. |
| 8,334,582 | B2 | 12/2012 | Jeng et al. |

(Continued)

FOREIGN PATENT DOCUMENTS

| | | |
|---|---|---|
| EP | 0579993 A1 | 1/1994 |
| EP | 0583585 A2 | 2/1994 |

(Continued)

*Primary Examiner* — Shaun Campbell
*Assistant Examiner* — Raj R Gupta
(74) *Attorney, Agent, or Firm* — Cantor Colburn LLP; Steven Meyers

(57) ABSTRACT

A method of forming a stacked assembly of semiconductor chips can include juxtaposing and metallurgically joining kerf metal elements exposed in kerf regions of a first wafer with corresponding kerf metal elements exposed in kerf regions of a second wafer, and affixing undiced semiconductor chips of the first wafer with corresponding undiced semiconductor chips of the second wafer. The assembled wafers are then cut along the dicing lanes thereof into a plurality of individual assemblies of stacked semiconductor chips, each assembly including an undiced semiconductor chip of the first wafer and an undiced semiconductor chip of the second wafer affixed therewith.

16 Claims, 3 Drawing Sheets

(56) References Cited

U.S. PATENT DOCUMENTS

| | | |
|---|---|---|
| 8,461,024 B2 | 6/2013 | Johnson |
| 8,569,899 B2 * | 10/2013 | Zhang et al. .................. 257/797 |
| 2012/0049884 A1 | 3/2012 | Kaltalioglu |
| 2012/0211748 A1 | 8/2012 | Miccoli et al. |
| 2012/0286429 A1 | 11/2012 | Han et al. |
| 2012/0313222 A1 * | 12/2012 | Lee et al. ...................... 257/620 |
| 2012/0322239 A1 | 12/2012 | Singh et al. |

FOREIGN PATENT DOCUMENTS

| | | |
|---|---|---|
| EP | 0738212 A1 | 10/1996 |
| EP | 1270232 A2 | 1/2003 |
| EP | 1721334 A2 | 11/2006 |
| EP | 2258512 A1 | 12/2010 |
| EP | 2286290 A1 | 2/2011 |
| EP | 2505297 A1 | 10/2012 |

* cited by examiner

FACILITATING CHIP DICING FOR METAL-METAL BONDING AND HYBRID WAFER BONDING

BACKGROUND

The present invention relates to a method for performing direct wafer-to-wafer bonding, including wafer multi-stacking, through metal features such as metal pads, lines, or patterns, on surfaces of the wafer to one another, prior to severing the joined wafers into individual units each containing a chip of a wafer and a chip of another wafer bonded to the wafer.

Assemblies of vertically stacked semiconductor chips having direct vertical electrical interconnections using through silicon vias (TSV) offer improvements in integration density and speed of information access.

Wafer-to-wafer bonding techniques can be used to join wafers together in vertically stacked wafer assemblies, which can then be diced into individual stacked semiconductor chip assemblies containing stacks of two or more semiconductor chips each. Each individual stacked semiconductor chip assembly may have through silicon vias extending in a vertical direction of the assembly for electrically connecting the chips therein. Wafer-to-wafer bonding techniques include metal-to-metal bonding in which flat metal elements, typically a plurality of discrete metal pads, at a surface of one wafer are joined with corresponding flat metal elements at a surface of a second wafer.

Metal-to-metal bonding techniques are subject to variations in bond strength between wafers due to misalignment between the metal elements of one wafer relative to the metal elements of another wafer to which they are to be bonded. Such misalignment can result in metal to oxide contact in a non-controlled fashion, or metal elements of one wafer not bonding with those of the other wafer.

Hybrid bonding, in which metal elements of respective wafers bond together as well as oxide elements of the respective wafers, leave large portions of the respective wafers unbonded, which include among others, kerf regions disposed between adjacent undiced semiconductor chips of a wafer. The unbonded areas can provide a potential source of cracking or chipping defects when dicing a stacked wafer assembly into a plurality of individual stacked semiconductor chip assemblies, especially in the case of wafer multi-stacking.

Despite these existing ways of joining wafers to one another, further improvements can be made.

SUMMARY

According to an aspect of the invention, a method of forming a stacked assembly of semiconductor chips includes metallurgically joining kerf metal elements exposed in a kerf region of a first wafer with corresponding kerf metal elements exposed in kerf regions of a second wafer, and affixing semiconductor chips of the first wafer with corresponding semiconductor chips of the second wafer which they face. The assembled wafers are then cut along the dicing lanes thereof into a plurality of individual assemblies of stacked semiconductor chips, each assembly including a semiconductor chip of the first wafer and a semiconductor chip of the second wafer affixed therewith. The simultaneous joining of such kerf metal elements, and optionally crackstop elements, which can be done simultaneously or at a different time than the joining of electrical connection elements for inter-chip connections between respective chips of the assembly, provides mechanical support to the assembly during the subsequent cutting into individual stacked chip assemblies.

In accordance with another aspect of the invention, a wafer subassembly is provided for use in forming a plurality of individual assemblies of stacked semiconductor chips. The wafer subassembly may include a semiconductor wafer and a plurality of kerf metal elements disposed in kerf regions at the surface of the wafer, the kerf regions disposed in dicing lanes between adjacent undiced semiconductor chips of the wafer, the kerf metal elements being configured for direct metal to metal bonding with corresponding kerf metal elements of a second wafer subassembly to form a stacked wafer assembly.

DETAILED DESCRIPTION

As will be described further below, first and second wafers can be assembled with one another by metallurgically joining metal elements in the kerf and in the chips. The elements in the chip serve as primarily electrical connections, while the elements in the kerf serve primarily as mechanical support and additional crack-stop and delamination protection structures. The kerf elements are disposed in dicing lanes of each wafer with corresponding kerf metal elements of the other wafer and affixing undiced semiconductor chips of the first semiconductor wafer with corresponding undiced semiconductor chips of the second wafer. Then the assembled wafers are cut along the dicing lanes into a plurality of assemblies of stacked semiconductor chips. Cutting the assembled wafers with a saw along the dicing lanes typically removes the kerf metal elements such that they are absent from the individual assemblies of stacked semiconductor chips. However, some of these additional kerf structures may also remain on the chip.

Figure 1:
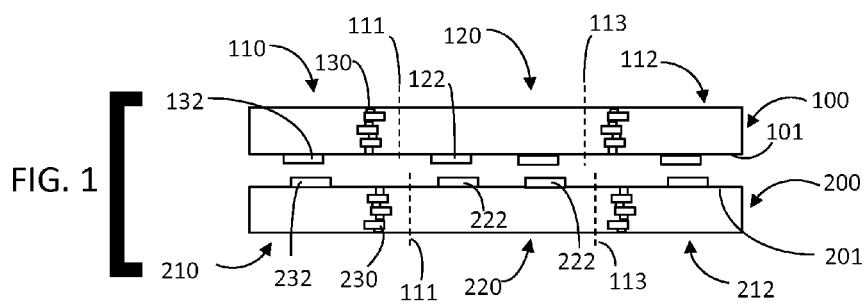
FIG. 1 is a sectional view illustrating first and second wafer assemblies each having metal elements at corresponding surfaces thereof.
Figure 2:
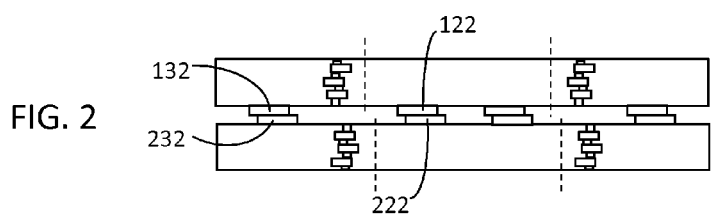
FIG. 2 is a sectional view illustrating a joined stacked wafer assembly formed by joining the first and second wafer assemblies shown in FIG. 1.

The method can be used in conjunction with assembly techniques in which chip metal elements disposed in undiced semiconductor chips regions of a first wafer are joined with corresponding chip metal elements of a second wafer which they face. In another example, the method can be used in conjunction with assembly techniques in which oxide elements in undiced semiconductor chips regions of a first wafer face and are joined with corresponding oxide elements of a second wafer. The wafers may be thinned prior to joining. For example, with the wafers shown in FIG. 1, the thickness of the first wafer 100 in a direction orthogonal to its surface 101 can be less than 100 microns between opposite surfaces of the first wafer. The corresponding thickness of the second wafer can be less than 100 microns. Referring to FIG. 1, first and second wafers 100, 200 each having metal elements at corresponding surfaces thereof, are shown in a state prior to the metal elements of the first wafer being metallurgically joined with corresponding metal elements of the second wafer. First wafer 100 includes undiced semiconductor chips 110 and 112 which are integral portions of a semiconductor wafer, as well as kerf region 120 being another integral portion of the first semiconductor wafer disposed between the undiced semiconductor chips 110, 120. "Edges", i.e., boundaries of each of the undiced semiconductor chips 110, 112 with the adjacent kerf region 120 of the first wafer, are shown at 111 and 113, respectively. These boundaries 111, 113 may be somewhat fluid as the width of the kerf region, and hence the exact location of the boundaries can depend upon the width of the cut produced by a saw used to sever the semiconductor chips from one another. In the wafer 100 shown in FIG. 1, a bulk semiconductor layer of the first wafer 100 can extend continuously within each of the regions occupied by the undiced first and second semiconductor chips and the kerf region 120. The second wafer 200 has a similar structure of undiced semiconductor chips 210 and 212 which are integral portions of a semiconductor wafer, as well as kerf region 220 being another integral portion of the first semiconductor wafer disposed between the undiced semiconductor chips 210, 220. Metal crack stop barriers 130, 230 of each chip are further shown in FIG. 1, these being within the areas of the undiced semiconductor chips 110, 112 of the second wafer adjacent to the boundaries 111, 113 thereof. The chips in FIGS. 1 and 2 are shown as aligned and/or bonded in a slightly misaligned state. The slight misalignment that results is not intentional, but rather a tolerable result of processing in accordance with the embodiments of the invention.

The first wafer 100 further includes a plurality of kerf metal elements 122 in the kerf region 120 at a surface 101 of the first wafer which face corresponding kerf metal elements 222 in the kerf region 220 at a surface 201 of the second wafer. In addition, a plurality of chip metal elements 132 at surfaces of the undiced semiconductor chips 110, 112 of the first wafer can be facing corresponding chip metal elements 232 at surfaces of the undiced semiconductor chips 210, 212 of the second wafer. Typically, the kerf metal elements and the chip metal elements are metal pads which may be formed of copper and may project above a surface of a dielectric layer, e.g., an oxide layer, at the surface of the wafer. In particular examples, the kerf metal elements and the chip metal elements can be passivated with a bonding agent or defluxing agent such as BTA, or may be coated with a metal barrier such as, for example, a barrier or manganese and manganese oxide (e.g., Mn/MnO).

FIG. 2 illustrates a further stage of processing in which the kerf metal elements 122, 222 of the first and second wafers, respectively, are metallurgically joined with one another. Typically, the kerf metal elements of each wafer are joined with those of the other wafer by direct metal-to-metal bonding. In some cases, joining can be performed using one or more of heat, pressure, and typically without a solder being disposed between the surfaces of the corresponding joined kerf metal elements of each wafer.

Undiced semiconductor chips of the first wafer 100 are also affixed with corresponding undiced semiconductor chips of the second wafer 200. In one example, corresponding chip metal elements 132, 232 of the first and second wafers are joined to one another. Typically, and the chip metal elements of each wafer are joined with one another by direct metal-to-metal bonding. In another example, undiced semiconductor chips of the respective wafers can be joined with one another using oxide elements at the facing surfaces of the respective wafers. In one example, the affixing of the semiconductor chips and the metallurgically joining are performed simultaneously.

Figure 3:
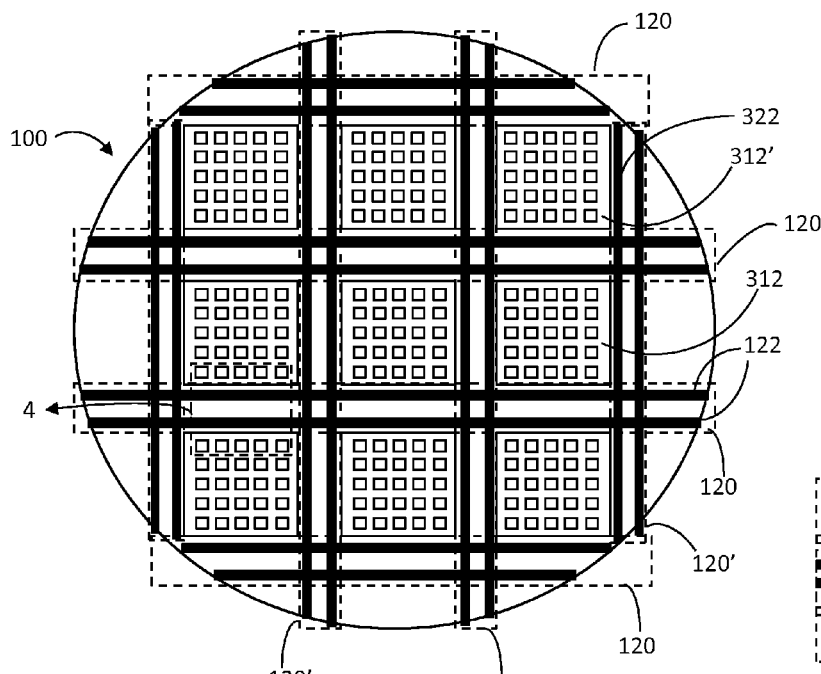
FIG. 3 is a plan view illustrating a wafer corresponding to the stacked wafer assembly shown in FIG. 2.
Figure 4:
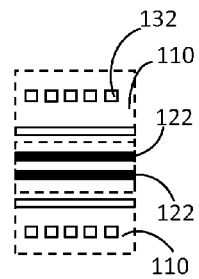
FIG. 4 is a detailed partial plan view further illustrating a portion of the wafer shown in FIG. 3.

FIG. 3 further illustrates the corresponding wafer assembly in which kerf regions 120 which extend in a horizontal layout direction of the wafer 100 are seen therein being generally coextensive with horizontal dicing lanes, and kerf regions 120' which extend in a vertical layout direction of the wafer 100 and are generally coextensive with vertical dicing lanes. Kerf metal elements in FIG. 3 extend full widths of chords which traverse the generally circular area of the wafer 100. Further detail of the structure shown in FIG. 3 can be seen in the detailed partial plan view provided in FIG. 4.

Referring to FIG. 3, in one example, the kerf metal elements of each wafer may include at least one continuous kerf metal element 322 which has a first portion extending in a first direction of a length of a first dicing lane 120' parallel to an edge of a first undiced semiconductor chip 312 and parallel to an edge of a second undiced semiconductor chip 312', and a second portion extending in the first direction, the second portion crossing a second dicing lane 120 that extends in a second direction between the first undiced semiconductor chip 312 and the second undiced semiconductor chip 322.

After joining the kerf metal elements and affixing the undiced semiconductor chips of the respective wafers with one another, the resulting stacked wafer assemblies are cut along the dicing lanes represented by kerf regions 120, 120' to form a plurality of individual stacked semiconductor chip assemblies. The cutting process, e.g., sawing process, can result in the removal the kerf metal elements 122 such that the kerf metal elements may be absent from the stacked semiconductor chip assemblies.

Figure 5:
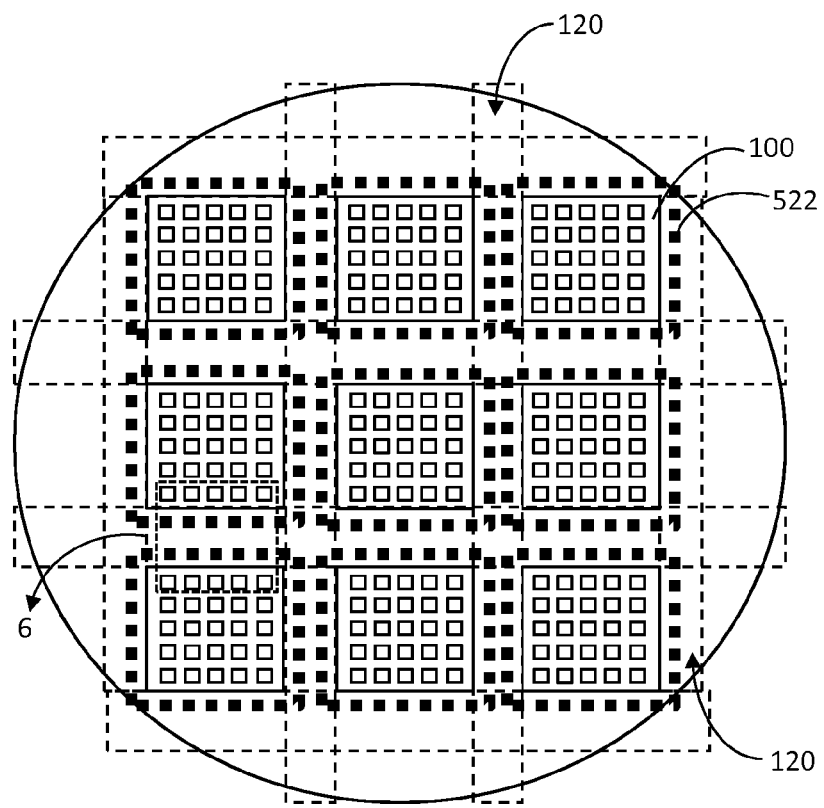
FIG. 5 is a plan view illustrating a structure of a wafer in accordance with a variation of the embodiment shown in FIG. 3.
Figures 6, 7, 8:
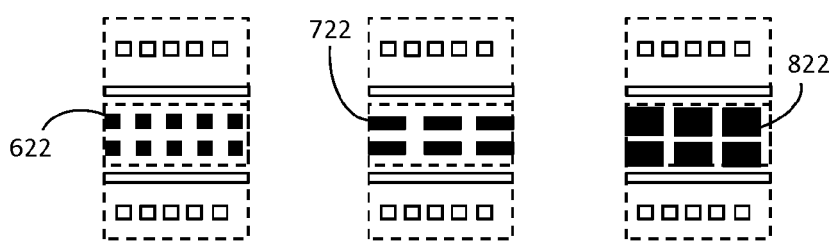
FIG. 6 is a detailed partial plan view further illustrating a portion of the wafer shown in FIG. 5 in accordance with one variation thereof.
FIG. 7 is a detailed partial plan view further illustrating a portion of the wafer shown in FIG. 5 in accordance with one variation thereof.
FIG. 8 is a detailed partial plan view further illustrating a portion of the wafer shown in FIG. 5 in accordance with one variation thereof.

The joined kerf metal elements can provide additional support to the chips of each wafer when dicing the stacked wafer assembly into the individual stacked assemblies of chips and also serve as additional crack-stops and delamination protection. This support can be especially advantageous when, as is common, the wafers have been thinned prior to being joined such that each wafer has a thickness 100 microns or less between its opposite major surfaces. FIG. 5 illustrates a variation of the embodiment shown in FIG. 3, in which the kerf metal elements 522 are provided in the respective kerf regions 120 as a plurality of discrete metal elements which are disposed adjacent to each of the undiced semiconductor chips 100 of each wafer. FIGS. 6, 7, and 8 provide a more detailed view of the kerf metal elements of FIG. 5 for the portion of FIG. 5 in the dashed outline therein. FIG. 6 depicts a particular example in which the length and width dimensions of each kerf metal element 622 in the horizontal and vertical layout directions of the wafer are about the same. FIG. 7 depicts another example in which the length dimension of each kerf metal element 722 is much greater than the width dimension of each kerf metal element. FIG. 8 depicts yet another example in which the width dimension of each kerf metal element 822 can be greater than the width dimension of each kerf metal element.

Figure 9:
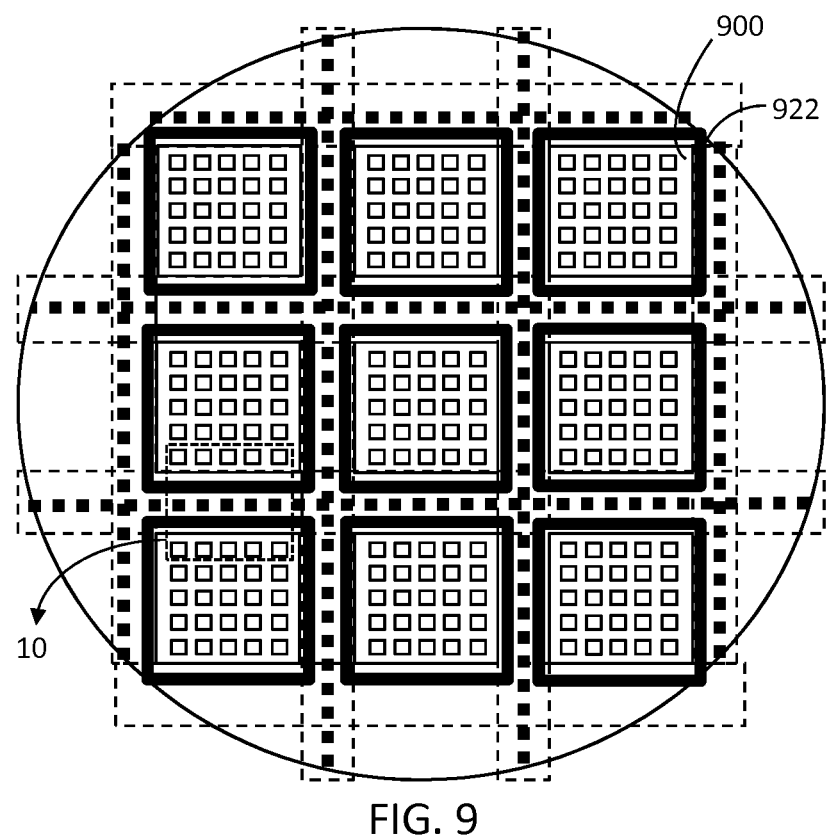
FIG. 9 is a plan view illustrating a structure of a wafer in accordance with a variation of the embodiment shown in FIG. 3.
Figure 10:
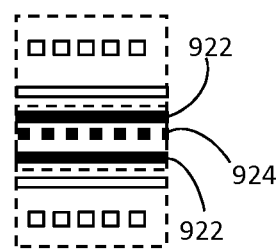
FIG. 10 is a detailed partial plan view further illustrating a portion of the wafer shown in FIG. 9.

FIGS. 9 and 10 illustrate another variation in which the kerf metal elements include individual rectangular frame elements 922. In this case, each individual rectangular frame element 922 surrounds an individual undiced semiconductor chip 100 of one of the wafers. In addition to the rectangular frame elements, the kerf metal elements of each wafer can also include discrete metal elements 924 provided as individually separated pads in the kerf region between the rectangular frame elements 922.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of forming a stacked assembly of semiconductor chips, comprising:
    causing kerf metal elements of a first wafer to face corresponding kerf metal elements of a second wafer, the kerf metal elements of each wafer being disposed in kerf regions at the surface of each wafer, the kerf regions of each wafer being disposed in dicing lanes between adjacent undiced semiconductor chips of each wafer;
    assembling the first and second wafers, including:
       affixing undiced semiconductor chips of the first wafer with corresponding undiced semiconductor chips of the second wafer; and
       metallurgically joining the kerf metal elements of the first wafer with the kerf metal elements of the second wafer; and
    cutting the assembled wafers along the dicing lanes thereof into a plurality of individual assemblies of stacked semiconductor chips, each assembly including a semiconductor chip of the first wafer and a semiconductor chip of the second wafer affixed therewith.

2. The method of claim 1, wherein after the cutting, at least portions of the kerf metal elements are present in individual assemblies of the plurality of the individual assemblies.

3. The method of claim 1, wherein the cutting removes the metallurgically joined kerf metal elements, such that the joined kerf metal elements are absent from each of the individual assemblies.

4. The method of claim 3, wherein the kerf metal elements include individual rectangular frame elements, each individual rectangular frame element surrounding an individual semiconductor chip of one of the wafers.

5. The method of claim 3, wherein the kerf metal elements of each wafer include at least one continuous kerf metal element which has a first portion extending in a first direction of a length of a first dicing lane parallel to an edge of a first undiced semiconductor chip and parallel to an edge of a second undiced semiconductor chip, and a second portion extending in the first direction, the second portion crossing a second dicing lane that extends in a second direction between the first undiced semiconductor chip and the second undiced semiconductor chip.

6. The method of claim 3, wherein a thickness of each wafer is less than 100 microns between opposite exterior surfaces of each wafer.

7. The method of claim 1, wherein the affixing of the undiced semiconductor chips includes joining chip metal elements at the surfaces of the facing undiced semiconductor chips with one another.

8. The method of claim 7, wherein the affixing of the undiced semiconductor chips and the metallurgically joining are performed simultaneously.

9. The method as claimed in claim 7, wherein the affixing of the undiced semiconductor chips further includes joining oxide or other bonding layer elements at the surfaces of the facing undiced semiconductor chips with one another.

10. The method of claim 7, wherein each of the kerf metal elements and the chip metal elements comprise copper or other suitable metallic materials and the affixing and the metallurgically joining includes direct metal-to-metal joining of the chip metal elements of the first wafer with the corresponding chip metal elements of the second wafer and simultaneous direct metal-to-metal joining of the kerf metal elements of the first wafer with the corresponding kerf metal elements of the second wafer.

11. A method of forming a stacked assembly of semiconductor chips, comprising:
    juxtaposing kerf metal elements of a first wafer with corresponding kerf metal elements of a second wafer, the kerf metal elements of each wafer being disposed in kerf regions at the surface of each wafer, the kerf regions of each wafer being disposed in dicing lanes between adjacent undiced semiconductor chips of each wafer; and
    juxtaposing chip metal elements of the first wafer with corresponding chip metal elements of the second wafer, each of the chip metal elements of each wafer being disposed in undiced semiconductor chip regions at the surface of each wafer, each undiced semiconductor chip region having peripheral edges bounded by kerf regions of the plurality of kerf regions;
    assembling the first and second wafers, including:
       metallurgically joining the kerf metal elements of the first wafer with the kerf metal elements of the second wafer, and metallurgically joining the chip metal elements of the first wafer with the chip metal elements of the second wafer; and
    cutting the assembled wafers along the dicing lanes thereof into a plurality of individual assemblies of stacked semiconductor chips, each assembly including a semiconductor chip of the first wafer and a semiconductor chip of the second wafer joined therewith, wherein the cutting removes the metallurgically joined kerf metal elements.

12. The method of claim 11, wherein the kerf metal elements are absent from each of the individual assemblies.

13. The method of claim 11, wherein after the cutting, at least portions of the kerf metal elements are present in individual assemblies of the plurality of the individual assemblies.

14. The method of claim 11, wherein the kerf metal elements of each wafer include at least one continuous kerf metal element which has a first portion extending in a first direction of a length of a first dicing lane parallel to an edge of a first undiced semiconductor chip and parallel to an edge of a second undiced semiconductor chip, and a second portion extending in the first direction, the second portion crossing a second dicing lane that extends in a second direction between the first undiced semiconductor chip and the second undiced semiconductor chip.

15. The method as claimed in claim 11, wherein the affixing of the undiced semiconductor chips further includes joining oxide or other bonding layer elements at the surfaces of the facing undiced semiconductor chips with one another.

16. A method of wafer multistacking utilizing a plurality of wafer subassemblies, comprising the steps of:
    aligning kerf metal elements of each of a plurality of wafer subassemblies with corresponding kerf metal elements of one or more wafer subassemblies adjacent thereto in a facing relationship in a stack of the wafer subassemblies, the kerf metal elements of each wafer subassembly being disposed in kerf regions at the surface of each wafer subassembly, the kerf regions of each wafer being disposed in dicing lanes between adjacent undiced semiconductor chips of each wafer subassembly;

assembling the plurality of wafer subassemblies, including:
- affixing undiced semiconductor chips of each wafer subassembly with corresponding undiced semiconductor chips of each wafer subassembly adjacent thereto; and
- metallurgically joining the aligned kerf metal elements in each of the plurality of wafer subassemblies with one another;

cutting the assembled wafers along the dicing lanes thereof into a plurality of individual assemblies of stacked semiconductor chips, each assembly including a semiconductor chip of each of the assembled wafer subassemblies.

* * * * *